(12) United States Patent
Barnes

(10) Patent No.: US 6,259,018 B1
(45) Date of Patent: Jul. 10, 2001

(54) CONDUCTOR STRUCTURE

(75) Inventor: William Barnes, Bristol (GB)

(73) Assignee: STMicroelectronics Limited, Almondsbury Bristol (GB)

( * ) Notice: Subject to any disclaimer, the term of this patent is extended or adjusted under 35 U.S.C. 154(b) by 0 days.

(21) Appl. No.: 09/494,340

(22) Filed: Jan. 28, 2000

(30) Foreign Application Priority Data

Feb. 12, 1999 (GB) .................................................. 9903254

(51) Int. Cl.[7] .................................................. H01B 11/12
(52) U.S. Cl. .................................................. 174/33
(58) Field of Search ........................ 174/32, 33, 34, 174/36, 261, 250, 117 F; 307/89–91; 364/489–491

(56) References Cited

U.S. PATENT DOCUMENTS

| | | | |
|---|---|---|---|
| 5,288,949 | 2/1994 | Crafts | 174/250 |
| 5,618,185 | * 4/1997 | Aekins | 174/34 X |
| 5,811,727 | * 9/1998 | Lo | 174/36 |
| 6,107,578 | * 8/2000 | Hashim | 174/250 |

FOREIGN PATENT DOCUMENTS 8 101854    4/1996 (JP) .

OTHER PUBLICATIONS

Standard Search Reports dated Mar. 9, 1999.
Patent Abstracts of Japan vol. 016, No. 570 (E–1297), Dec. 10, 1992 & JP 04 221837 Aug, 12, 1.

* cited by examiner

Primary Examiner—Dean A. Reichard
Assistant Examiner—Chau N. Nguyen
(74) Attorney, Agent, or Firm—Wolf, Greenfield & Sacks, P.C.; James H. Morris; Theodore E. Galanthay

(57) ABSTRACT

A wiring structure has at least three conductors each having a respective first portion running substantially mutually parallel on the first planar path and a second portion, the second portions running substantially mutually parallel on a second planar path to a set of terminals. At least one pair of conductors which are mutually adjacent on the first path are separated on the second path by at least one other of the conductors.

6 Claims, 2 Drawing Sheets

CONDUCTOR STRUCTURE

FIELD OF THE INVENTION

The present invention relates to a conductor structure for timing signals, and more particularly but not exclusively to such a structure in an integrated circuit.

BACKGROUND OF THE INVENTION

The high complexity of modern integrated circuits means that large amounts of information are capable of being handled. The processing which takes place in integrated circuits is typically performed in response to control signals, such as clock signals, and the high speed of processing which is currently being achieved makes it important that such control signals are transferred in the minimum possible time.

Those skilled in the art will appreciate that different control signals may need to be transmitted over respective conductors which are closely adjacent to one another, and it is therefore clearly a desirable feature to reduce as far as possible any cross-talk between adjacent conductors.

The cross-talk between adjacent conductors can be quantified by the inter-conductor capacitance.

It will be further clear to those skilled in the art that a major factor in the efficiency of an integrated circuit is the performance of the longest conductor of a set carrying control signals, because the propagation time along the longest conductor of a set will clearly be the longest.

It is an object of the present invention to provide an improved conductor structure.

It is an aim of embodiments of the invention to provide a wiring structure in which the capacitance of a longest of the conductors with respect to the other conductors of the set is reduced.

SUMMARY OF THE INVENTION

According to a first aspect of the present invention there is provided a wiring structure for timing signals comprising at least three spaced conductors having portions disposed substantially parallel to each other, said portions being of different lengths and comprising a longest said portion and a shortest said portion, wherein the longest said portion forms one extreme side of said wiring structure and the shortest said portion is disposed next to the longest said portion whereby delay in the conductor to which said longest portion belongs, said delay being due to cross-talk with others of said conductors, is reduced.

Preferably said portions further comprise a next longest said portion, said next longest said portion being disposed next to the shortest said portion.

According to a second aspect of the present invention there is provided a wiring structure for timing signals comprising at least three conductors and a corresponding number of terminals, each said conductor having a respective first portion, said first portions running substantially mutually parallel on a first planar path, and a respective second portion, said second portion running substantially mutually parallel on a second planar path from said first path to the terminals, wherein at least one pair of conductors which are mutually adjacent on said first path are separated on said second path by at least one other of said conductors.

According to a third aspect of the present invention there is provided a wiring structure for timing signals, comprising at least three conductors and a corresponding number of terminals, said conductors each having a respective first portion, said first portions running substantially mutually parallel on a first planar path and a respective second portion, said second portions running substantially mutually parallel on a second planar path from said first path to the terminals, wherein said terminals are disposed such that the lengths of the second portions of said conductors differ, and said conductors comprise a first conductor having a longest second portion and a second conductor having a next longest second portion, said first and said second conductors being adjacent along said first path and in said second path being disposed such that a second portion of at least one other of said conductors is between said first and second conductors.

Preferably the second planar path is substantially perpendicular to the first planar path.

Preferably the plane of the first planar path does not intersect the plane of the second planar path.

BRIEF DESCRIPTION OF THE DRAWINGS

An embodiment of the present invention will now be described with respect to the accompanying drawings.

DESCRIPTION OF THE PREFERRED EMBODIMENTS

Figure 1:
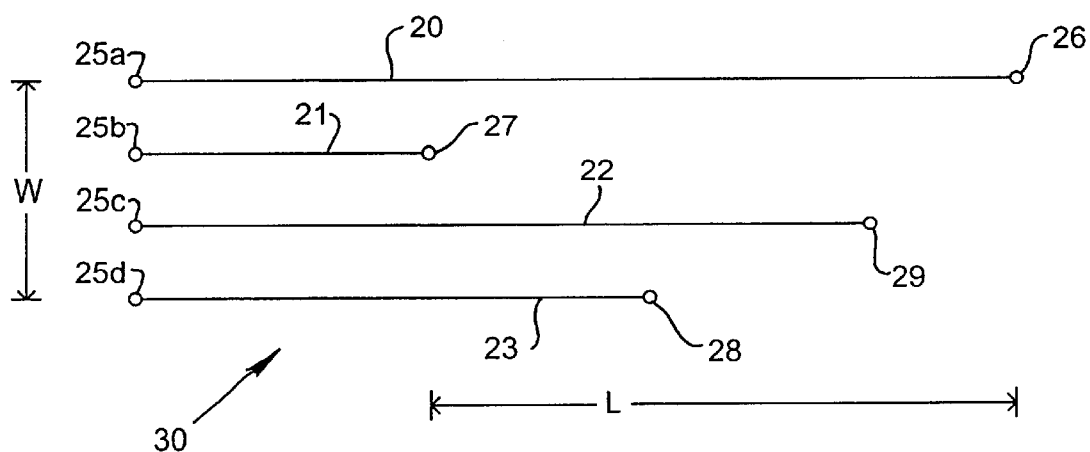
FIG. 1 shows a block schematic diagram of a first embodiment of a wiring structure in accordance with the present invention.

In the various figures like reference numerals refer to like parts.

Referring first to FIG. 1 a wiring structure 30 comprises four spaced conductors 20–23 which are disposed substantially parallel to each other and are separated by equal spacings. A first conductor 20, disposed at one extreme side of the wiring structure is the longest conductor, extending as shown from a terminal 25a to an end point 26. The adjacent conductor 21 extends parallel to the first conductor 20 from a terminal 25b to an end point 27. The next conductor 22 is the second-longest conductor and extends from a first terminal 25c to an end point 29 and the fourth conductor 23 is intermediate in length between conductor 22 and the shortest conductor 21, conductor 23 extending from a terminal 25d to point 28.

The difference in length between the shortest conductor 21 and the longest conductor 20 is L and the separation between the first conductor 20 and the fourth conductor 23 is W.

Where L is very much greater than W, the arrangement shown provides the least delay to the longest conductor 20. This is because the capacitance between the longest conductor 20 and adjacent conductors is minimized by being placed adjacent to the shortest conductor.

Figure 2:
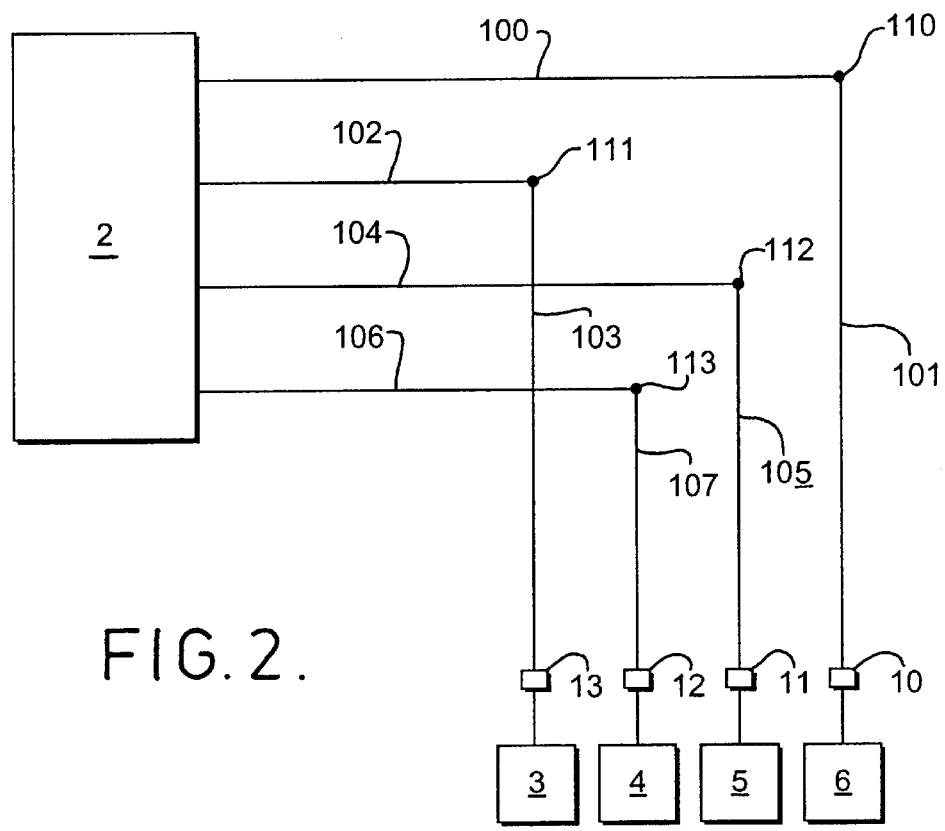
FIG. 2 shows a block schematic diagram of a second embodiment of a wiring structure in accordance with the present invention.

Referring now to FIG. 2, a wiring structure 1 of an integrated circuit extends between a generator of control signals 2 and a set of load devices 3–6. The load devices have respective terminals 10–13 which are arranged substantially in a straight line. In this figure, four conductors are shown and consist of a first conductor 100, 101, a second conductor 102, 103, a third conductor 104, 105 and a fourth conductor 106, 107.

The conductors each consist of two portions, of which first portion 100, 102, 104, 106 run mutually parallel along a first path. The conductors also each have respective second portion, 101, 103, 105, 107 which run mutually parallel to one another, but along a second path.

Figure 3:
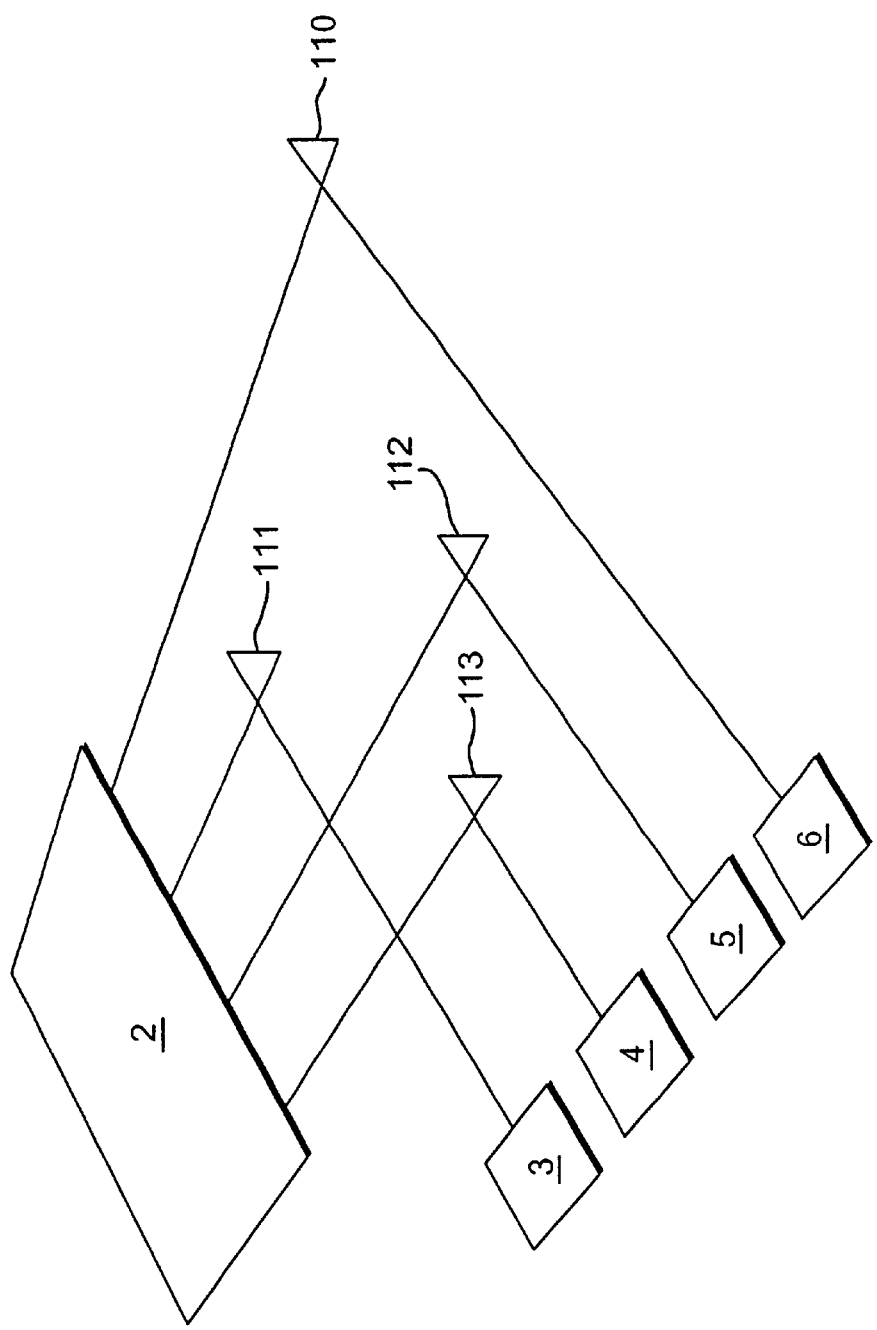
FIG. 3 shows a perspective view of the arrangement of FIG. 2.

As shown in FIG. 2 in this embodiment, the first and second paths are perpendicular to one another. As best seen in FIG. 3, the first portion 100, 102, 104, 106 extend in a first plane and the second portions 101, 103, 105, 107 in a second plane above, as shown, the first plane. There are provided connecting conductors 110–113 linking each first portion 100,102,104,106 with its associated second portion 101,103, 105,107. The connecting conductors in an integrated circuit will typically be so-called 'via' conductors.

Further inspection of FIG. 2 shows that the first conductor 100, 101 has the longest first portion 100.

Further inspection shows that the second conductor 102, 103 has the shortest first portion 102.

On the first path, the first portion 102 of the second conductor 102, 103 runs adjacent to the first conductor 100, 101, with the third conductor 104, 105 having its first portion 104 also adjacent to the first portion 102 of the second conductor 102, 103. The fourth conductor 106, 107 has the first portion 104 of the third conductor 104, 105 adjacent to it on the first path.

The disposition of the conductors on the second path is however different to that on the first path. Specifically, the second portion 105 of the third conductor 104, 105 is adjacent to the second portion 101 of the first conductor, and between the second portion 105 of the third conductor and the second portion 103 of the second conductor lies the second portion 107 of the fourth shortest second conductor 106, 107.

This interleaved arrangement of the second portions of the conductors on the second path produces a substantial reduction in capacitance between the longest conductor 100, 101 and the second conductor 102, 103.

In a typical structure, the width of the first path, defined by the linear spacing between the first portion 100 of the first conductor and the first portion 106 of the fourth conductor is very much less than the spacing between terminals 10–13 of the load devices 3–6, which corresponds to the width of the second path. Typically, the width of the first path may be 4 micrometres and the width of the second path 200 micrometres.

Although the description relates to an embodiment in which a single control signal generator is provided, it will be understood that this is not restrictive. Specifically, separate sources of timing signals may be provided. It is also envisaged that different types of signals may be provided via each of the conductors.

What is claimed is:

1. A wiring structure for timing signals comprising at least three conductors and a corresponding number of terminals, each said conductor having a respective first portion, said first portions running substantially mutually parallel on a first planar path, and a respective second portion, said second portions running substantially mutually parallel on a second planar path from said first path to the terminals, wherein at least one pair of said at least three conductors which are mutually adjacent on said first path are separated on said second path by at least one other of said conductors.

2. A wiring structure as claimed in claim 1 wherein the second planar path is substantially perpendicular to the first planar path.

3. A wiring structure as claimed in claim 1 wherein the plane of the first planar path does not intersect the plane of the second planar path.

4. A wiring structure for timing signals, comprising at least three conductors and a corresponding number of terminals, said conductors each having a respective first portion, said first portions running substantially mutually parallel on a first planar path and a respective second portion, said second portions running substantially mutually parallel on a second planar path from said first path to the terminals, wherein said terminals are disposed such that the lengths of the second portions of said conductors differ, and said conductors comprise a first conductor having a longest second portion and a second conductor having a next longest second portion, said first and said second conductors being adjacent along said first path and in said second path being disposed such that a second portion of at least one other of said conductors is between said first and second conductors.

5. A wiring structure as claimed in claim 4 wherein the second planar path is substantially perpendicular to the first planar path.

6. A wiring structure as claimed in claim 4 wherein the plane of the first planar path does not intersect the plane of the second planar path.

* * * * *